(12) United States Patent
Zilber et al.

(10) Patent No.: US 7,033,664 B2
(45) Date of Patent: Apr. 25, 2006

(54) METHODS FOR PRODUCING PACKAGED INTEGRATED CIRCUIT DEVICES AND PACKAGED INTEGRATED CIRCUIT DEVICES PRODUCED THEREBY

(75) Inventors: Gil Zilber, Ramat Gan (IL); Reuven Katraro, Rishon le Zion (IL); Doron Teomim, Modiin (IL)

(73) Assignee: Tessera Technologies Hungary Kft, (HU)

( * ) Notice: Subject to any disclaimer, the term of this patent is extended or adjusted under 35 U.S.C. 154(b) by 0 days.

(21) Appl. No.: 10/277,498

(22) Filed: Oct. 22, 2002

(65) Prior Publication Data

US 2004/0076797 A1   Apr. 22, 2004

(51) Int. Cl.
*B32B 3/24* (2006.01)
*B32B 3/10* (2006.01)
*H01L 23/02* (2006.01)

(52) U.S. Cl. .................. 428/131; 428/166; 428/137; 428/68; 428/69; 428/76; 428/178; 257/433; 257/431; 257/432; 257/414; 257/678; 257/687; 257/253; 257/684; 257/434; 257/730

(58) Field of Classification Search ............... 428/166, 428/137, 131, 68, 69, 76, 178; 257/434, 257/730, 433, 431, 432, 414, 678, 687, 253, 257/684; 438/49, 64, 116, 125
See application file for complete search history.

(56) References Cited

U.S. PATENT DOCUMENTS

| | | | |
|---|---|---|---|
| 2,507,956 A | 5/1950 | Bruno et al. | |
| 2,796,370 A | 6/1957 | Ostrander et al. | |
| 2,851,385 A | 9/1958 | Spruance, Jr. et al. | |
| 4,551,629 A | 11/1985 | Carson et al. | |
| 4,633,573 A | 1/1987 | Scherer | |
| 4,764,846 A | 8/1988 | Go | |
| 4,794,092 A | 12/1988 | Solomon | |
| 4,862,249 A | 8/1989 | Carlson | |
| 4,908,086 A | 3/1990 | Goodrich et al. | |
| 4,943,844 A | 7/1990 | Oscilowski et al. | |
| 4,984,358 A | 1/1991 | Nelson | |
| 5,037,779 A * | 8/1991 | Whalley et al. | 257/687 |
| 5,104,820 A | 4/1992 | Go et al. | |
| 5,124,543 A | 6/1992 | Kawashima | |
| 5,126,286 A | 6/1992 | Chance | |
| 5,177,753 A | 1/1993 | Tanaka | |
| 5,266,501 A | 11/1993 | Imai | |
| 5,266,833 A | 11/1993 | Capps | |
| 5,321,303 A | 6/1994 | Kawahara et al. | |
| 5,455,386 A * | 10/1995 | Brathwaite et al. | 174/52.4 |
| 5,455,455 A | 10/1995 | Badehi | |
| 5,500,540 A | 3/1996 | Jewell et al. | |
| 5,505,985 A | 4/1996 | Nakamura et al. | |
| 5,546,654 A | 8/1996 | Wojnarowski et al. | |
| 5,547,906 A | 8/1996 | Badehi | |

(Continued)

FOREIGN PATENT DOCUMENTS

EP   490739   6/1992

(Continued)

*Primary Examiner*—William P. Watkins, III
(74) *Attorney, Agent, or Firm*—Lerner, David, Littenberg, Krumholz & Mentlik, LLP

(57) ABSTRACT

A crystalline substrate based device including a crystalline substrate having formed thereon a microstructure and at least one packaging layer which is formed over the microstructure and defines therewith at least one gap between the crystalline substrate and the at least one packaging layer and at least one opening in the packaging layer communicating with the at least one gap.

37 Claims, 5 Drawing Sheets

U.S. PATENT DOCUMENTS

| | | |
|---|---|---|
| 5,567,657 A | 10/1996 | Wojnarowski et al. |
| 5,610,431 A | 3/1997 | Martin |
| 5,612,570 A | 3/1997 | Eide et al. |
| 5,657,206 A | 8/1997 | Pedersen et al. |
| 5,660,741 A | 8/1997 | Suzuki et al. |
| 5,661,087 A | 8/1997 | Pedersen et al. |
| 5,675,180 A | 10/1997 | Pedersen et al. |
| 5,703,400 A | 12/1997 | Wojnarowski et al. |
| 5,716,759 A | 2/1998 | Badehi |
| 5,719,979 A | 2/1998 | Furuyama |
| 5,798,557 A | 8/1998 | Salatino et al. |
| 5,814,894 A | 9/1998 | Igarashi et al. |
| 5,817,541 A | 10/1998 | Averkiou et al. |
| 5,824,204 A | 10/1998 | Jerman |
| 5,837,566 A | 11/1998 | Pedersen et al. |
| 5,849,623 A | 12/1998 | Wojnarowski et al. |
| 5,857,858 A | 1/1999 | Gorowitz et al. |
| 5,859,475 A | 1/1999 | Freyman et al. |
| 5,869,353 A | 2/1999 | Levy et al. |
| 5,888,884 A | 3/1999 | Wojnarowski |
| 5,891,761 A | 4/1999 | Vindasius et al. |
| 5,900,674 A | 5/1999 | Wojnarowski et al. |
| 5,909,052 A | 6/1999 | Ohta et al. |
| 5,915,168 A | 6/1999 | Salatino et al. |
| 5,925,973 A | 7/1999 | Eda et al. |
| 5,938,452 A | 8/1999 | Wojnarowski |
| 5,952,712 A | 9/1999 | Ikuina et al. |
| 5,965,933 A | 10/1999 | Young et al. |
| 5,969,461 A | 10/1999 | Anderson et al. |
| 5,980,663 A | 11/1999 | Badehi |
| 5,981,945 A | 11/1999 | Spaeth et al. |
| 5,985,695 A | 11/1999 | Freyman et al. |
| 5,986,746 A | 11/1999 | Metz et al. |
| 5,993,981 A | 11/1999 | Askinazi et al. |
| 5,996,199 A | 12/1999 | Ichikawa et al. |
| 6,002,163 A | 12/1999 | Wojnarowski |
| 6,020,217 A | 2/2000 | Kuisi et al. |
| 6,046,410 A | 4/2000 | Wojnarowski et al. |
| 6,060,778 A | 5/2000 | Jeong et al. |
| 6,062,461 A | 5/2000 | Sparks et al. |
| 6,072,236 A | 6/2000 | Akram et al. |
| 6,080,596 A | 6/2000 | Vindasius et al. |
| 6,083,766 A | 7/2000 | Chen |
| 6,087,586 A * | 7/2000 | Chen .................. 174/52.4 |
| 6,092,280 A | 7/2000 | Wojnarowski |
| 6,098,278 A | 8/2000 | Vintasius et al. |
| 6,106,735 A * | 8/2000 | Kurle et al. .................. 216/2 |
| 6,111,274 A | 8/2000 | Arai |
| 6,124,637 A | 9/2000 | Freyman et al. |
| 6,134,118 A | 10/2000 | Pedersen et al. |
| 6,168,965 B1 | 1/2001 | Malinovich et al. |
| 6,215,642 B1 | 4/2001 | Sogard |
| 6,235,141 B1 | 5/2001 | Feldman et al. |
| 6,265,763 B1 | 7/2001 | Jao et al. |
| 6,268,231 B1 | 7/2001 | Wetzel |
| 6,285,064 B1 | 9/2001 | Foster |
| 6,351,027 B1 | 2/2002 | Giboney et al. |
| 6,495,398 B1 | 12/2002 | Goetz |
| 6,507,097 B1 | 1/2003 | Goetz et al. |
| 6,548,895 B1 * | 4/2003 | Benavides et al. .......... 257/712 |
| 6,548,911 B1 | 4/2003 | Yu et al. |
| 6,768,190 B1 | 7/2004 | Yang et al. |
| 2003/0186482 A1 * | 10/2003 | Schuurmans et al. ....... 438/106 |

FOREIGN PATENT DOCUMENTS

| | | |
|---|---|---|
| JP | 63-166710 | 7/1988 |
| WO | WO 85/02283 | 5/1985 |
| WO | WO 89/04113 | 5/1989 |
| WO | WO 95/19645 | 7/1995 |

* cited by examiner

METHODS FOR PRODUCING PACKAGED INTEGRATED CIRCUIT DEVICES AND PACKAGED INTEGRATED CIRCUIT DEVICES PRODUCED THEREBY

FIELD OF THE INVENTION

The present invention relates to integrated circuits and similar devices generally.

BACKGROUND OF THE INVENTION

U.S. Pat. Nos. 5,716,759, and 5,980,663 and 6,777,767, of the present assignee relate to the field of the invention.

SUMMARY OF THE INVENTION

The present invention seeks to provide improved packaged crystalline substrate based devices and methods for producing same.

There is thus provided in accordance with a preferred embodiment of the present invention a crystalline substrate based device including a crystalline substrate having formed thereon a microstructure and at least one packaging layer which is formed over the microstructure and defines therewith at least one gap between the crystalline substrate and the at least one packaging layer and at least one opening in the packaging layer communicating with the at least one gap.

There is also provided in accordance with another preferred embodiment of the present invention a packaged crystalline substrate including a substrate having formed thereon a microstructure and at least one package which is attached to the substrate over the microstructure and defines therewith at least one gap, the at least one package containing at least one opening communicating with the at least one gap.

In accordance with a preferred embodiment of the present invention the at least one packaging layer is attached to the crystalline substrate using an adhesive. Preferably, the adhesive includes epoxy. Alternatively, the adhesive includes Thermoplastic materials. In another preferred embodiment, the adhesive includes Thermosetting materials.

Alternatively, the at least one packaging layer is attached to the crystalline substrate using a soldering. Additionally or alternatively, the at least one packaging layer is attached to the crystalline substrate using intermetalic layer.

Preferably, the crystalline substrate includes silicon. Alternatively, the crystalline substrate includes lithium niobate. Additionally, the crystalline substrate includes lithium tantalite. In accordance with another preferred embodiment, the crystalline substrate includes quartz. Alternatively, the crystalline substrate includes GaAs.

In accordance with another preferred embodiment, the at least one packaging layer is at least partially transparent. Preferably, the at least one packaging layer is transparent at least in the spectral range of 100 nm–20 micron.

In accordance with yet another embodiment the at least one cavity includes a plurality of cavities.

Preferably, the microstructure includes a micromechanical structure. Alternatively, the microstructure includes a microelectronic structure. Additionally or alternatively, the microstructure includes an optoelectronic structure.

In accordance with still another embodiment the gap is filled with fluid.

DETAILED DESCRIPTION OF PREFERRED EMBODIMENTS

Figure 1A:
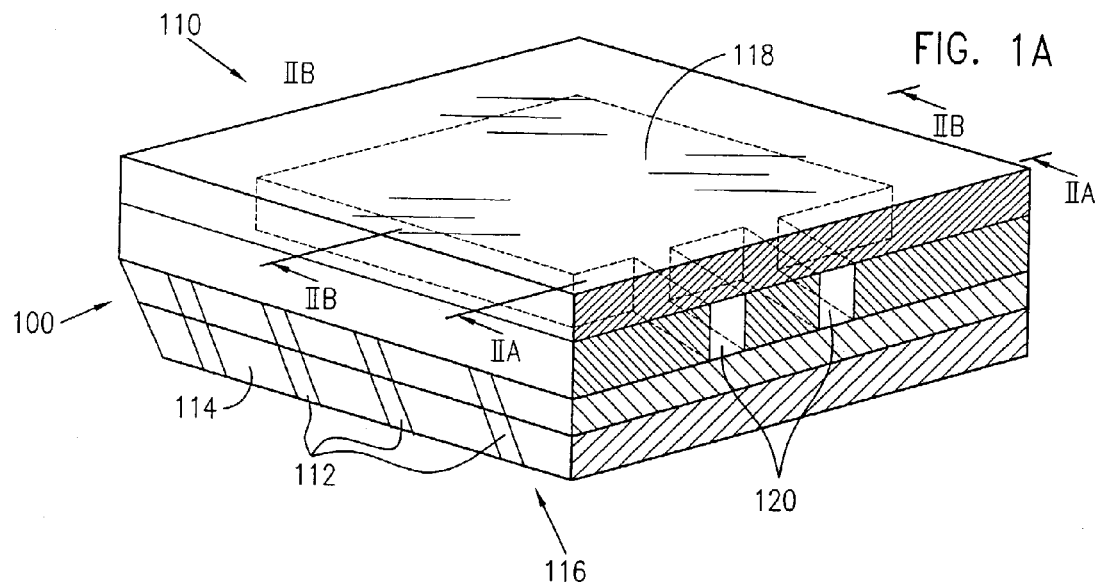
FIGS. 1A and 1B are pictorial illustrations of a crystalline substrate based device having an internal cavity, constructed and operative in accordance with preferred embodiments of the present invention.
Figure 1B:
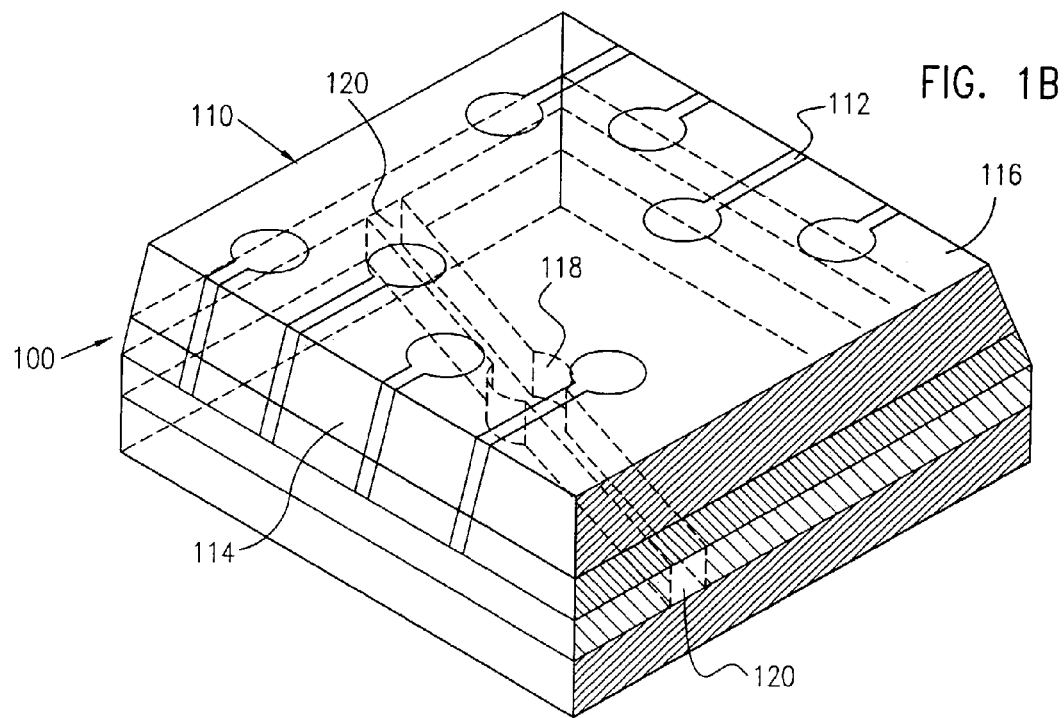

Reference is now made to FIGS. 1A and 1B, which are pictorial illustrations of integrated circuit devices constructed and operative in accordance with preferred embodiments of the present invention. As seen in FIG. 1A, the integrated circuit device 100 includes a relatively thin and compact, environmentally protected and mechanically strengthened integrated circuit package 110 having a multiplicity of electrical contacts 112 plated along the edge surfaces 114 thereof.

Preferably, contacts 112 extend over edge surfaces onto the underside planar surface 116 of the package. This contact arrangement permits both flat surface mounting and edge mounting of package 110 onto a circuit board. It is noted that the integrated circuit package 110 may include one or more of the following elements (not shown): an integrally formed dichroic filter, color filter, antireflective coating, polarizer, optical grating, integrated wave guide and optical coupling bumps.

In accordance with a preferred embodiment of the present invention, the integrated circuit package 110 defines a cavity 118, which is indicated in phantom lines. Integrated circuit package 110 also defines one or more openings 120 which allow fluid communication with the interior of cavity 118.

The embodiment shown in FIG. 1B is shown from an opposite orientation. Thus, as seen in the embodiment of FIG. 1B, contacts 112 extend over edge surfaces onto the top planar surface 116 of the package, corresponding to underside planar surface 116 of FIG. 1A. The embodiment of FIG. 1B also differs from that shown in FIG. 1A in that multiple communication openings 120 are defined on opposite sides of cavity 118. It is appreciated that communication openings 120 may be located in any appropriate position in reference to cavity 118.

Figure 2A:
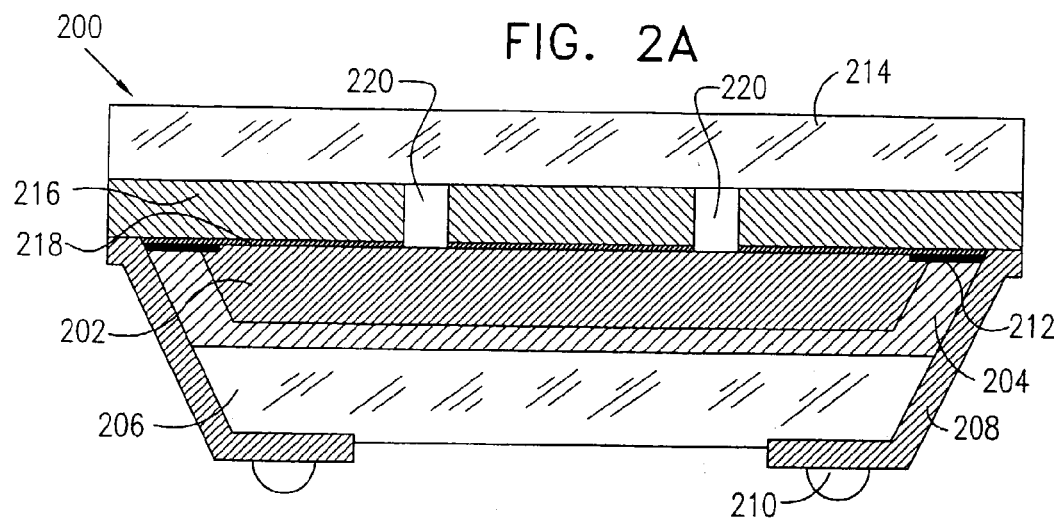
FIGS. 2A and 2B are simplified sectional illustrations of the integrated circuit device shown in FIG. 1A, taken along lines IIA—IIA and IIB—IIB, respectively.
Figure 2B:
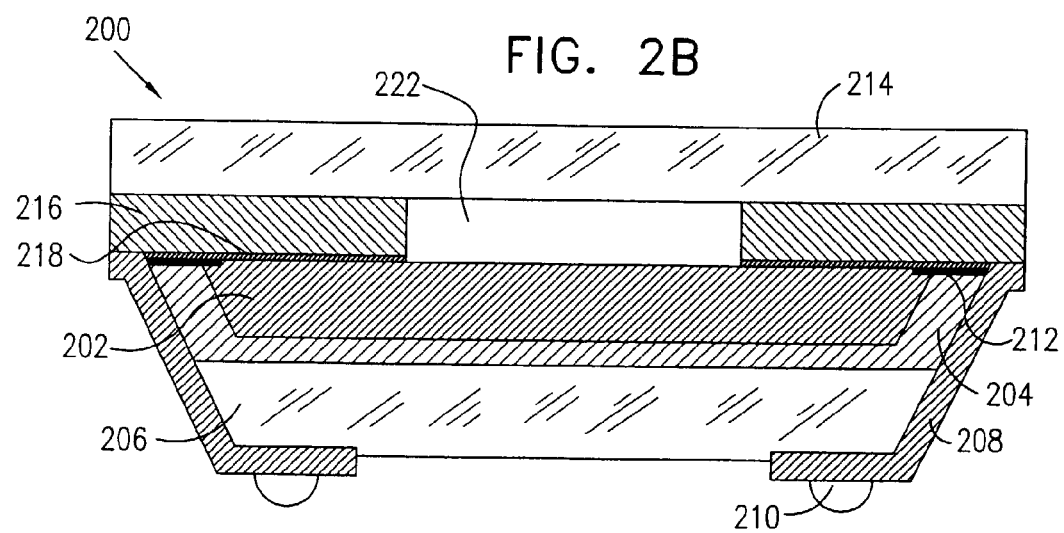

Reference is now made to FIGS. 2A and 2B, which are simplified sectional illustrations of the integrated circuit device shown in FIG. 1A, taken along lines IIA—IIA and IIB—IIB, respectively. As seen in FIG. 2A, an integrated circuit device 200 includes a crystalline substrate 202. Underlying the substrate 202 and sealed thereto by electrically isolated material 204 is a packaging layer 206, typically formed of ceramic, along edges of which are formed electrical contacts 208, typically defining bumps 210. Conductive pads 212 preferably connect substrate 202 to electrical contacts 208.

In accordance with a preferred embodiment of the present invention a packaging layer 214, typically formed of ceramic, plastic or organic materials, and associated spacer elements 216, are attached utilizing an attaching layer 218, by a conventional attaching technique such as epoxy, soldering intermetalic, Thermoplastic, or Thermosetting process, to substrate 202, so as to define openings 220 between the substrate 202 and layer 214.

As seen in FIG. 2B, integrated circuit device 200 also includes a cavity 222 defined between substrate 202 and layer 214.

Typically, openings 220 are provided to enable the introduction of biological fluids or other suitable fluids into cavity 222, where they are analyzed by sensors located on substrate 202, or to perform a suitable biological or chemical reaction in order to analyze or modify the fluids as necessary. Alternatively, openings 220 enable the introduction of liquid crystal for liquid crystal displays.

It is appreciated that packaging layer 214 may be transparent and may have formed thereon a dichroic filter and/or anti-reflective coating. Packaging layer 214 may also be provided with one or more openings, to enable the introduction of biological fluids or other suitable fluids into cavity 222.

Figure 3A:
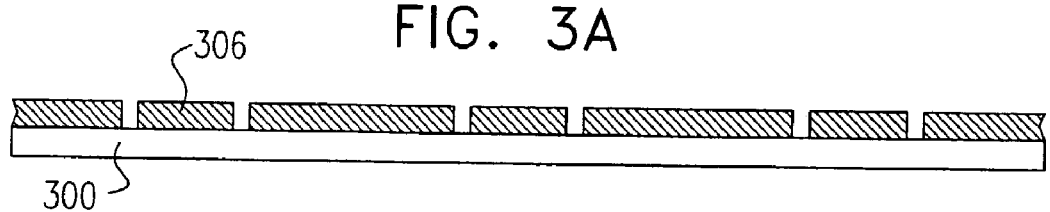
FIGS. 3A and 3B are simplified illustrations of a packaging layer for use in crystalline substrate based device in accordance with a preferred embodiment of the present invention.
Figure 3B:
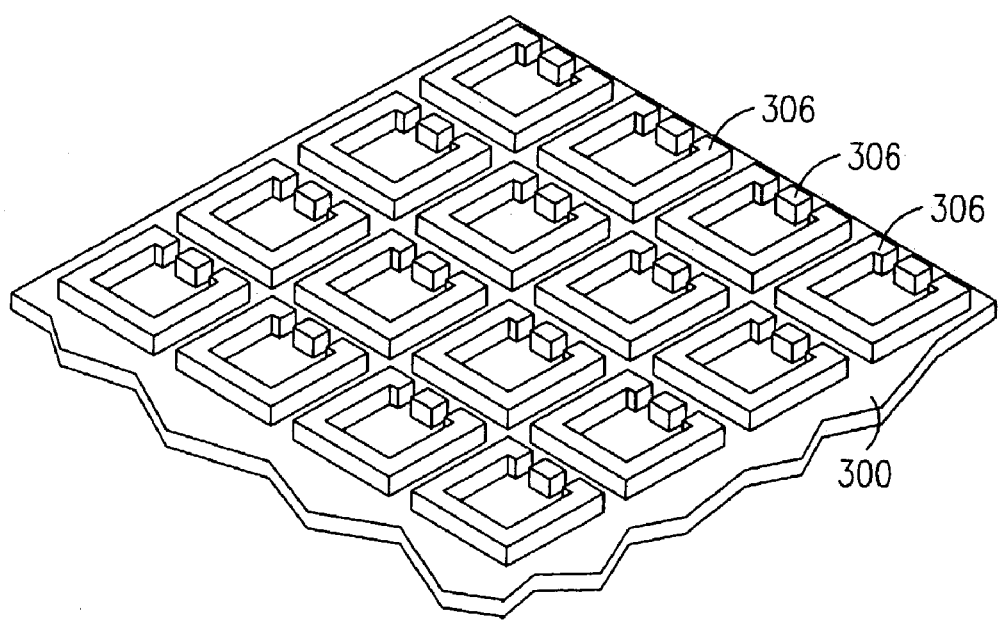

Reference is now made to FIGS. 3A and 3B, which are simplified illustrations of a packaging layer for use in crystalline substrate based device in accordance with a preferred embodiment of the present invention. The packaging layer consists of a substrate 300 typically formed of ceramic and spacers 306 shown in FIGS. 3A and 3B, which are typically of a partially rectangular configuration, as indicated in FIG. 3B.

Reference is now made to FIGS. 4A, 4B, 4C, 4D, 4E, 4F, 4G, 4H & 4I, which are simplified illustrations of steps in a method for producing a crystalline substrate based device similar to that shown in FIG. 1A, clearly illustrating the formation of the openings described therein, in accordance with a preferred embodiment of the present invention.

Figure 4A:
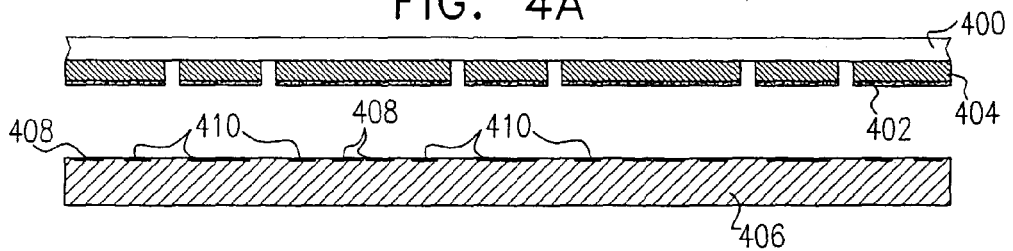
FIGS. 4A, 4B, 4C, 4D, 4E, 4F, 4G, 4H and 4I are simplified illustrations of steps in a method for producing a crystalline substrate based device of the type shown in FIGS. 1A and 1B in accordance with a preferred embodiment of the present invention.

As seen in FIG. 4A, a packaging layer 400, typically of the type shown in FIGS. 3A and 3B, is provided. Attaching layer 402 is applied thereto, preferably along the exposed surfaces of spacers 404 formed thereon. Attaching layer 402 is preferably a high temperature epoxy, soldering, or intermetalic layer.

Figure 4B:
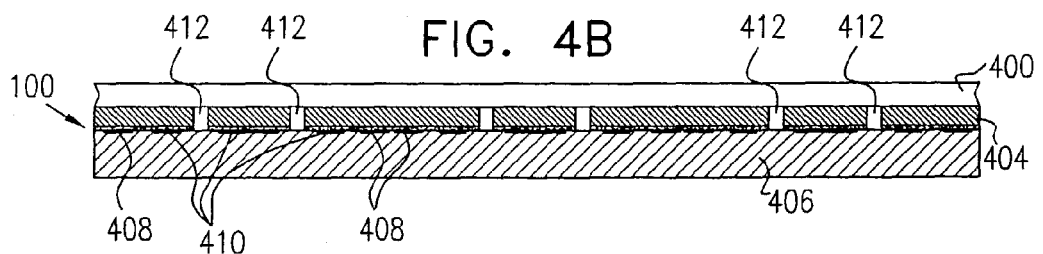

As shown in FIG. 4B, the packaging layer 400, thus prepared, is attached to a crystalline substrate 406, having defined thereon conductive pads 408 and circuitry 410. It is appreciated that circuitry 410 may be comprised of electrical circuitry, optoelectric components, optomechanical components or any other suitable device. It is also appreciated that typically, circuitry 410 is in electrical communication with conductive pads 408. As seen in FIG. 4B, a series of communicating openings 412 is this defined between the packaging layer 400 and the substrate 406, in accordance with a preferred embodiment of the present invention.

Figure 4C:
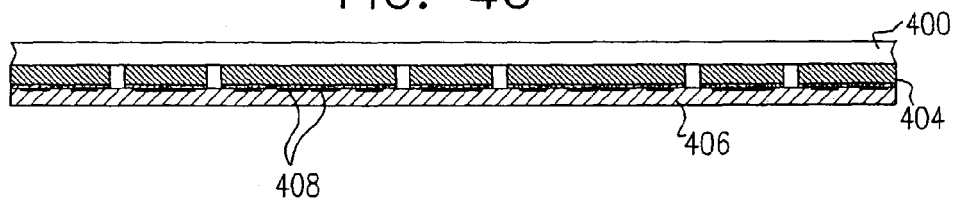
Figure 4D:
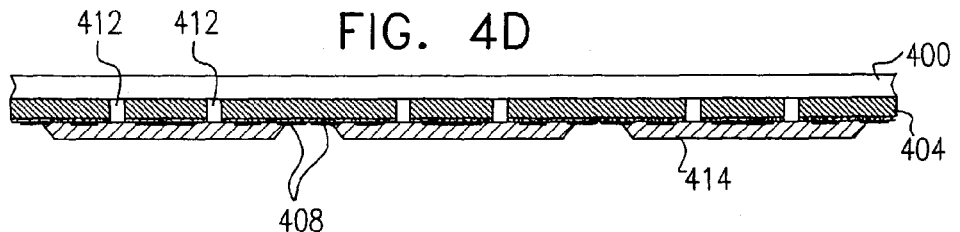
Figure 4E:
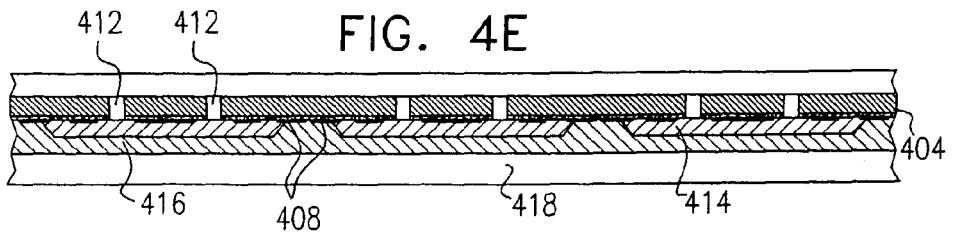

The crystalline substrate 406 is preferably lapped, as shown in FIG. 4C and etched, as shown in FIG. 4D, to define separate substrates 414. Following etching, the substrates 414 are adhered via an epoxy layer 416 to an underlying packaging layer 418, as shown in FIG. 4E.

Figure 4F:
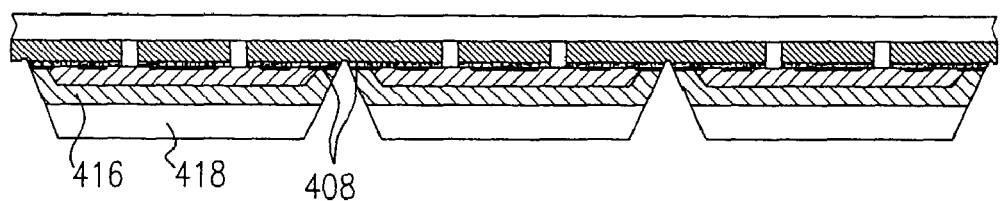
Figure 4G:
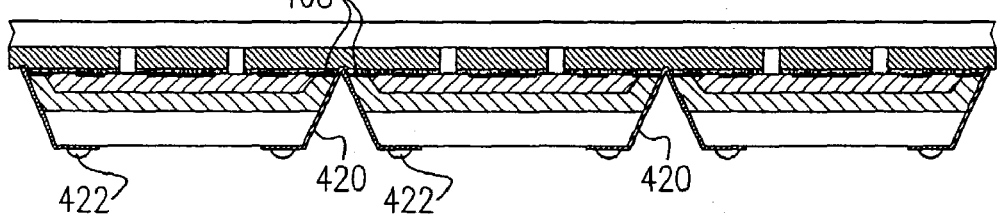
Figure 4H:
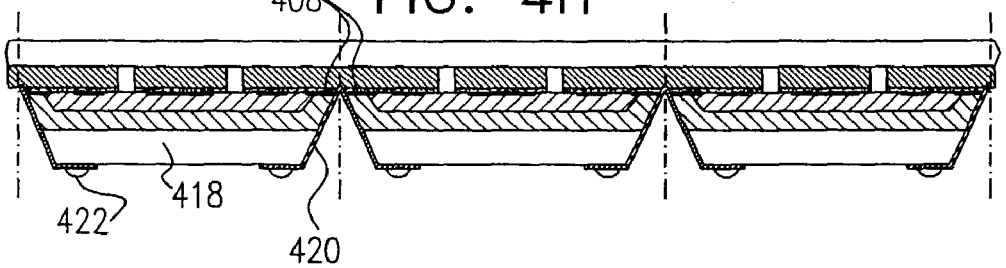
Figure 4I:
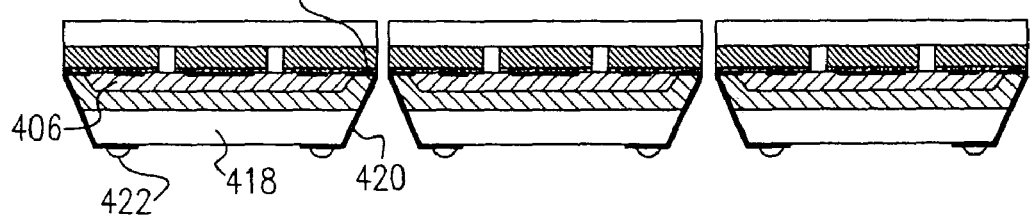

As seen in FIG. 4F, the packaging layer 418 and epoxy layer 416 are mechanically notched and thereafter electrical contacts 420 and typically bumps 422 are formed thereon, as seen in FIG. 4G. The resulting assembly is diced as shown in FIG. 4H to yield a plurality of packaged integrated circuit devices, as seen in FIG. 4I. It is noted that electrical contacts 420 are in electrical contact with conductive pads 408 defined in substrate 406, as seen in the drawings.

It is appreciated that here and throughout all of the examples described herein, the crystalline substrate may be any suitable crystalline substrate and may comprise, for example, silicon, lithium niobate, lithium tantalite, quartz, GaAs or any other suitable material.

The manufacturing techniques described hereinabove and hereinbelow may but need not necessarily include techniques described in any of the following U.S. Patents of the present assignee, the disclosure of which is hereby incorporated by reference: U.S. Pat. Nos. 5,716,759; 5,980,663 and 6,777,767.

It will be appreciated by persons skilled in the art that the present invention is not limited by what has been particularly shown and described hereinabove. Rather the scope of the present invention includes both combinations and subcombinations of various features described hereinabove as well as modifications and variations thereof which would occur to a person of skill in the art upon reading the foregoing description and referring to the drawings and which are not in the prior art.

The invention claimed is:

1. A crystalline substrate based device comprising:
    a crystalline substrate having formed thereon a microstructure;
    at least one chip scale packaging layer which is formed over said microstructure;
    a spacer element, disposed between said at least one chip scale packaging layer and said crystalline substrate, said crystalline substrate, said at least one chip scale packaging layer and said spacer element defining at least one gap between said crystalline substrate and said at least one chip scale packaging layer, said crystalline substrate, said microstructure and said at least one chip scale packaging layer forming a chip scale package having two major faces and a plurality of edge faces extending along the periphery of and between said major faces;
    at least one opening in said spacer element along one of said plurality of edge faces of said chip scale package communicating with said at least one gap; and
    at least one electrical contact formed on said chip scale package.

2. A crystalline substrate based device according to claim 1 and wherein said at least one chip scale packaging layer is attached to said crystalline substrate using an adhesive.

3. A crystalline substrate based device according to claim 1 and wherein said at least one chip scale packaging layer is attached to said crystalline substrate using a soldering material.

4. A crystalline substrate based device according to claim 1 and wherein said at least one chip scale packaging layer is attached to said crystalline substrate using intermetalic layer.

5. A crystalline substrate based device according to claim 2 and wherein said adhesive comprises Thermoplastic materials.

6. A crystalline substrate based device according to claim 2 and wherein said adhesive comprises Thermosetting materials.

7. A crystalline substrate based device according to claim 2 and wherein said adhesive comprises epoxy.

8. A crystalline substrate based device according to claim 1 and wherein said crystalline substrate comprises silicon.

9. A crystalline substrate based device according to claim 1 and wherein said crystalline substrate comprises lithium niobate.

10. A crystalline substrate based device according to claim 1 and wherein said crystalline substrate comprises lithium tantalite.

11. A crystalline substrate based device according to claim 1 and wherein said crystalline substrate comprises quartz.

12. A crystalline substrate based device according to claim 1 and wherein said crystalline substrate comprises GaAs.

13. A crystalline substrate based device according to claim 1 and wherein said at least one chip scale packaging layer is at least partially transparent.

14. A crystalline substrate based device according to claim 13 and wherein said at least one chip scale packaging layer is transparent at least in the spectral range of 100 nm–20 micron.

15. A crystalline substrate based device according to claim 1 and wherein said at least one gap comprises a plurality of gaps.

16. A crystalline substrate based device according to claim 1 and wherein said microstructure comprises a micromechanical structure.

17. A crystalline substrate based device according to claim 1 and wherein said microstructure comprises a microelectronic structure.

18. A crystalline substrate based device according to claim 1 and wherein said microstructure comprises an optoelectronic structure.

19. A packaged crystalline substrate comprising:
a substrate having formed thereon a microstructure;
at least one chip scale package which is attached to said substrate over said microstructure, said at least one chip scale package having two major faces and a plurality of edge faces extending along the periphery of and between said major faces, and including a spacer element disposed between said at least one chip scale package and said substrate, said substrate, said at least one chip scale package and said spacer element defining at least one gap between said substrate and said at least one chip scale package, said at least one chip scale package containing at least one opening along at least one of said plurality of edge faces of said at least one chip scale package communicating with said at least one gap; and
at least one electrical contact formed on said at least one chip scale package.

20. A packaged crystalline substrate according to claim 19 and wherein said at least one chip scale package is attached to said substrate using an adhesive.

21. A packaged crystalline substrate according to claim 19 and wherein said at least one chip scale package is attached to said substrate using a soldering material.

22. A packaged crystalline substrate according to claim 19 and wherein said at least one chip scale package is attached to said substrate using intermetalic layer.

23. A packaged crystalline substrate based device according to claim 20 and wherein said adhesive comprises Thermosetting materials.

24. A packaged crystalline substrate based device according to claim 20 and wherein said adhesive comprises Thermoplastic materials.

25. A packaged crystalline substrate based device according to claim 20 and wherein said adhesive comprises epoxy.

26. A packaged crystalline substrate according to claim 19 and wherein said substrate comprises silicon.

27. A packaged crystalline substrate according to claim 19 and wherein said substrate comprises lithium niobate.

28. A packaged crystalline substrate according to claim 19 and wherein said substrate comprises lithium tantalite.

29. A packaged crystalline substrate according to claim 19 and wherein said substrate comprises quartz.

30. A packaged crystalline substrate according to claim 19 and wherein said substrate comprises GaAs.

31. A packaged crystalline substrate according to claim 19 and wherein said at least one chip scale package is at least partially transparent.

32. A packaged crystalline substrate according to claim 19 and wherein said at least one gap comprises a plurality of gaps.

33. A packaged crystalline substrate according to claim 19 and wherein said microstructure comprises a micromechanical structure.

34. A packaged crystalline substrate according to claim 19 and wherein said microstructure comprises a microelectronic structure.

35. A packaged crystalline substrate according to claim 19 and wherein said microstructure comprises an optoelectronic structure.

36. A packaged crystalline substrate according to claim 19 and wherein said at least one gap is filled with fluid.

37. A crystalline substrate based device according to claim 31 and wherein said at least one chip scale packaging layer is transparent at least in the spectral range of 100 nm–20 micron.

* * * * *